United States Patent
Mitomi et al.

(10) Patent No.: US 9,548,027 B2
(45) Date of Patent: *Jan. 17, 2017

(54) DISPLAY APPARATUS, DRIVING METHOD FOR DISPLAY APPARATUS AND ELECTRONIC APPARATUS

(71) Applicant: Sony Corporation, Tokyo (JP)

(72) Inventors: Yutaka Mitomi, Kanagawa (JP); Masatsugu Tomida, Aichi (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,731

(22) Filed: Jun. 18, 2015

(65) Prior Publication Data

US 2016/0049117 A1    Feb. 18, 2016

Related U.S. Application Data

(63) Continuation of application No. 14/457,375, filed on Aug. 12, 2014, now Pat. No. 9,165,501, which is a (Continued)

(30) Foreign Application Priority Data

Jun. 13, 2007    (JP) ................................. 2007-155892

(51) Int. Cl.
*G09G 3/30*    (2006.01)
*G09G 3/32*    (2016.01)
(Continued)

(52) U.S. Cl.
CPC .......... *G09G 3/3291* (2013.01); *G09G 3/2092* (2013.01); *G09G 3/3233* (2013.01);
(Continued)

(58) Field of Classification Search
CPC . G09G 3/3291; G09G 3/2092; G09G 2320/04
(Continued)

(56) References Cited

U.S. PATENT DOCUMENTS 9,165,501 B2 * 10/2015 Mitomi ................ G09G 3/3233
2002/0196212 A1    12/2002 Nishitoba et al.
(Continued)

FOREIGN PATENT DOCUMENTS

JP    2006-133542    5/2006

*Primary Examiner* — Ilana Spar
*Assistant Examiner* — Jeffrey S Steinberg
(74) *Attorney, Agent, or Firm* — Michael Best & Friedrich LLP

(57) ABSTRACT

Disclosed herein is a display apparatus, including: a pixel array section including a plurality of pixels, a writing transistor, a driving transistor, a first switching transistor, a holding capacitor, and a second switching transistor; a first scanning section configured to drive the writing transistor in a unit of a row of the pixels; a second scanning section configured to drive the switching transistors in synchronism with scanning by the first scanning section; and a third scanning section configured to control the second switching transistors to a non-conducting state within a period after the image signal is written by the writing transistor until the signal writing period of the same row of the pixels ends but to a conducting state within any other period.

13 Claims, 10 Drawing Sheets

Related U.S. Application Data continuation of application No. 13/466,316, filed on May 8, 2012, now Pat. No. 9,013,372, which is a continuation of application No. 12/153,555, filed on May 21, 2008, now Pat. No. 8,232,935.

(51) Int. Cl.
*H01L 27/32* (2006.01)
*G09G 3/20* (2006.01)

(52) U.S. Cl.
CPC ...... *H01L 27/3262* (2013.01); *H01L 27/3265* (2013.01); *G09G 2300/0819* (2013.01); *G09G 2300/0842* (2013.01); *G09G 2310/0208* (2013.01); *G09G 2310/0251* (2013.01); *G09G 2320/0233* (2013.01); *G09G 2320/04* (2013.01)

(58) Field of Classification Search
USPC .................................. 345/76–83; 315/169.3
See application file for complete search history.

(56) References Cited

U.S. PATENT DOCUMENTS

| | | |
|---|---|---|
| 2004/0155873 A1 | 8/2004 | Miyazawa |
| 2006/0244688 A1 | 11/2006 | Ahn et al. |
| 2006/0262110 A1 | 11/2006 | Fukuda et al. |
| 2006/0273999 A1 | 12/2006 | Yamazaki et al. |
| 2007/0057873 A1 | 3/2007 | Uchino et al. |
| 2007/0063935 A1 | 3/2007 | Yoshida |
| 2007/0236424 A1* | 10/2007 | Kimura ................ G09G 3/3233 345/76 |
| 2010/0156860 A1* | 6/2010 | Yamamoto ........... G09G 3/3233 345/205 |

* cited by examiner

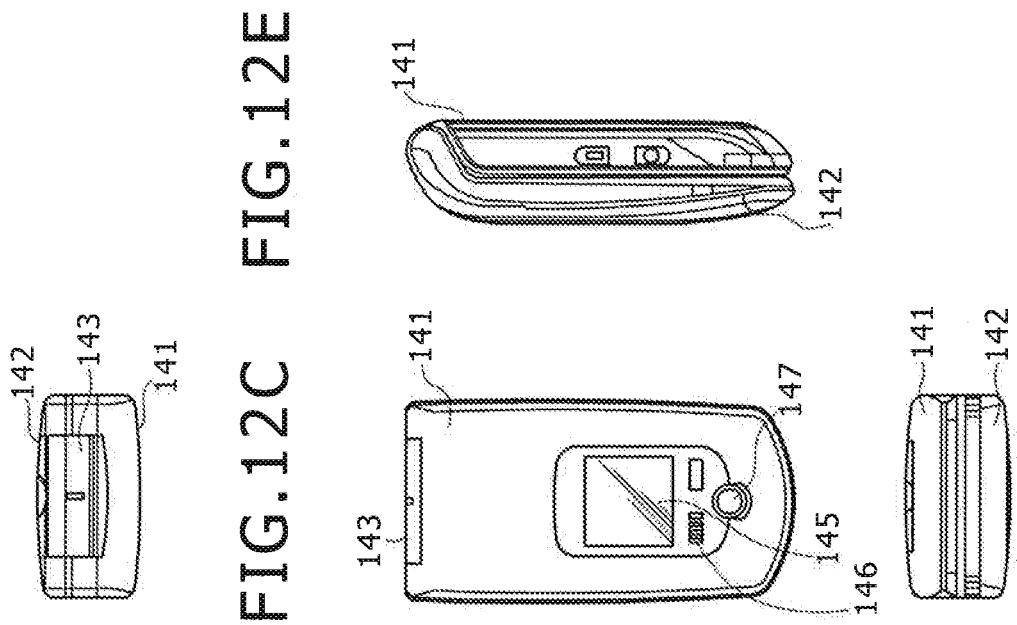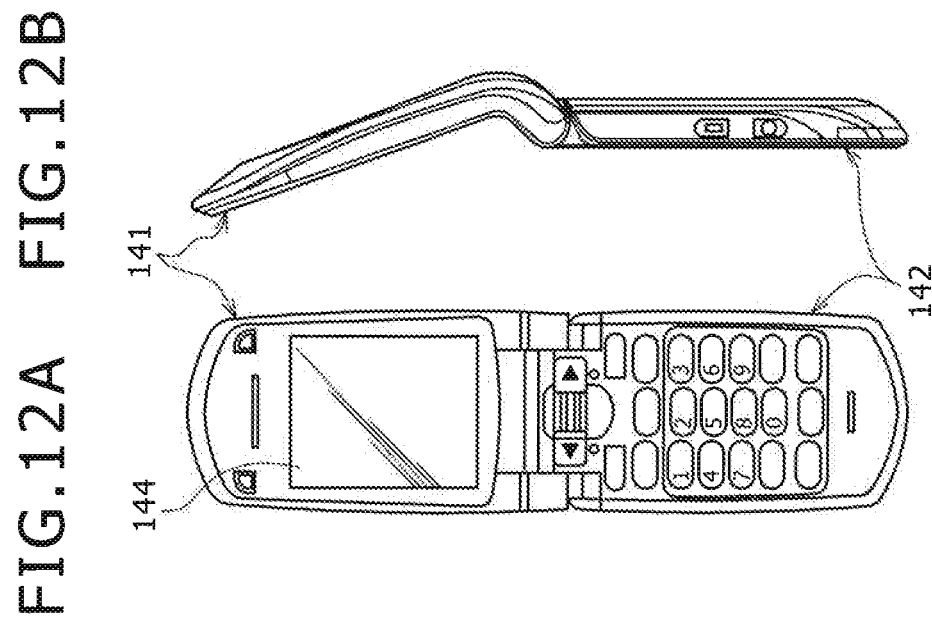

DISPLAY APPARATUS, DRIVING METHOD FOR DISPLAY APPARATUS AND ELECTRONIC APPARATUS

CROSS REFERENCES TO RELATED APPLICATIONS

This is a Continuation application of U.S. patent application Ser. No. 14/457,375 filed on Aug. 12, 2014, which is a Continuation application of U.S. patent application Ser. No. 13/466,316 filed on May 8, 2012, now U.S. Pat. No. 9,013,372 issued on Apr. 21, 2015, which is a Continuation application of U.S. patent application Ser. No. 12/153,555 filed on May 21, 2008, now U.S. Pat. No. 8,232,935 issued on Jul. 31, 2012, which in turn claims priority from Japanese Application No.: 2007-155892, filed on Jun. 13, 2007, the entire contents of which are incorporated herein by reference.

BACKGROUND OF THE INVENTION

1. Field of the Invention

This invention relates to a display apparatus, a driving method for a display apparatus and an electronic apparatus, and more particularly to a display apparatus of the flat type or flat panel type wherein a plurality of pixels each including an electric optical device are disposed in rows and columns, that is, in a matrix, and a driving system for a display apparatus of the type described and an electronic apparatus which includes a display apparatus of the type.

2. Description of the Related Art

In recent years, in the field of display apparatus for displaying an image, display apparatus of the flat type wherein a plurality of pixels or pixel circuits each including a light emitting device are arranged in rows and columns, that is, in a matrix, have been popularized rapidly. As one of such display apparatus of the flat type, an organic EL (Electro Luminescence) display apparatus has been developed and commercialized. The organic EL display apparatus uses an organic EL device as a light emitting device for pixels. The organic EL device is an electro-optical device of the current-driven type whose light emission luminance varies in response to the value of current flowing through the device, and particularly utilizes a phenomenon that an organic thin film emits light if an electric field is applied thereto.

The organic EL display apparatus has the following characteristics. In particular, since the organic EL device can be driven with an applied voltage equal to or lower than 10 V, it is low in power consumption. Further, the organic EL device is a self-luminous device. Therefore, in comparison with a liquid crystal display apparatus wherein the intensity of light from a light source called backlight is controlled by a liquid crystal cell included in each pixel to display an image, the organic EL display apparatus is superior in visual observability of a display image. Besides, since the organic EL display apparatus does not demand an illuminating member such as a backlight which is essentially required by the liquid crystal display apparatus, it is easy to reduce the size and thickness. Further, since the response speed of the organic EL device is as high as approximately several microseconds, no after image appears upon display of moving pictures on the organic EL display apparatus.

The organic EL display apparatus can adopt a simple (passive) matrix system and an active matrix system as a driving system similarly to the liquid crystal display apparatus. However, although the display apparatus of the simple matrix type is simple in structure, it has such a problem that it is difficult to implement the same as a display apparatus of a large size and a high definition because the light emission period of the electro-optical device decreases as the number of scanning lines, that is, the number of pixels, increases.

Therefore, in recent years, development of display apparatus of the active matrix system has been and is being carried out energetically wherein current flowing through an electro-optical device is controlled by an active device provided in a pixel circuit which includes the electro-optical device, for example, an insulated gate type field effect transistor, usually a TFT (Thin Film Transistor). The display apparatus of the active matrix system can be implemented readily as a display apparatus of a large size and a high definition since light emission of the electro-optical device continues over a period of one frame.

Incidentally, it is generally known that the I-V characteristic, that is, the current-voltage characteristic, of the organic EL device deteriorates as time passes. Such deterioration is called age deterioration or age-related deterioration. In a pixel circuit which uses an N-channel type TFT as a transistor for current driving an organic EL device (such a transistor is hereinafter referred to as "driving transistor"), the organic EL device is connected to the source side of the driving transistor. Therefore, if the I-V characteristic of the organic EL device exhibits age deterioration, then the gate-source voltage $V_{gs}$ of the driving transistor varies, resulting in variation also of the light emission luminance of the organic EL device.

This is described more particularly. The source potential of the driving transistor depends upon the working point of the driving transistor and the organic EL device. If the I-V characteristic of the organic EL device deteriorates, then the operating point of the driving transistor and the organic EL device varies, and consequently, even if the same voltage is applied to the gate of the driving transistor, the source potential of the driving transistor varies. Since this varies the source-gate voltage $V_{gs}$ of the driving transistor, the value of current flowing through the driving transistor varies. As a result, the value of current flowing through the organic EL device varies, and this varies the light emission luminance of the organic EL device.

On the other hand, a pixel circuit which uses a polycrystalline silicon TFT suffers, in addition to age deterioration of the I-V characteristic of the organic EL device, from age deterioration of the threshold voltage $V_{th}$ of the driving transistor or the mobility $\mu$ of a semiconductor thin film which forms a channel of the driving transistor (such mobility is hereinafter referred to as driving transistor mobility). Further, in the pixel circuit, the threshold voltage $V_{th}$ or the mobility $\mu$ differs among different pixels or individual transistor characteristics have a dispersion thereamong due to a dispersion in the fabrication process.

If the threshold voltage $V_{th}$ or the mobility $\mu$ of the driving transistor differs among different pixels, then this gives rise to a dispersion in value of current flowing through the driving transistor among different pixels. Therefore, even if the same voltage is applied to the gate of the driving transistor among the pixels, a dispersion appears in the light emission luminance of the organic EL device among the pixels, and this degrades the uniformity of the screen image.

Therefore, in order to keep the light emission luminance of the organic EL device fixed without being influenced even if the I-V characteristic of the organic EL device exhibits age deterioration or the threshold voltage $V_{th}$ or the mobility $\mu$ of the driving transistor exhibits age variation, correction functions are provided for each pixel circuit. In particular, a compensation function for compensating for the characteristic variation of the organic EL device, a function for carrying out correction against the variation of the threshold voltage Vth of the driving transistor (such correction is hereinafter referred to as "threshold value correction") and a function for carrying out correction against the variation of the mobility μ of the driving transistor (such correction is hereinafter referred to as "mobility correction") are provided for each pixel circuit. A pixel circuit of the configuration described is disclosed, for example, in Japanese Patent Laid-Open No. 2006-133542 (hereinafter referred to as Patent Document 1).

Where each pixel circuit includes the compensation function for the characteristic variation of the organic EL device and the correction functions against the variation of the threshold voltage Vth and the mobility μ of the driving transistor in this manner, even if the I-V characteristic of the organic EL device exhibits age deterioration or the threshold voltage Vth or the mobility μ of the driving transistor exhibits age variation, the light emission luminance of the organic EL device can be kept fixed without being influenced by such age deterioration or age variation.

SUMMARY OF THE INVENTION

Here, a case is studied wherein, in a certain pixel, a switching transistor connected in series to the driving transistor for controlling light emission of the organic EL device suffers from leak because of failure in characteristic or the like.

It is assumed that, after the writing transistor samples an image signal to write a signal voltage into the gate electrode of the driving transistor within a signal writing period, the signal voltage is held as the gate-source voltage Vgs of the driving transistor. In this instance, if the switching transistor suffers from leak and current flows from a power supply to the driving transistor through the switching transistor, then the source node of the driving transistor is charged. Therefore, the source potential of the driving transistor rises. This is hereinafter described in more detail.

If the source potential of the driving transistor rises within the signal writing period due to leak from the switching transistor in this manner, then if it is assumed that the gate-souse voltage Vgs of the driving transistor is same in all pixels, then the gate-source voltage Vgs of the driving transistor of the pixel with which the leak occurs is lower than that of the other pixels. This decreases the driving current to be supplied from the driving transistor to the organic EL device, and consequently, the light emission luminance of the pixel becomes lower than that of the other pixels and the pixel becomes darker.

Therefore, it is demanded to provide a display apparatus, a driving method for a display apparatus and an electronic apparatus wherein, even if a switching transistor for controlling light emission of an electro-optical device such as an organic EL device suffers from leak, drop of the light emission luminance arising from the leak within a signal writing period can be suppressed.

According to an embodiment of the present invention, there is provided a display apparatus including a pixel array section including a plurality of pixels disposed in rows and columns and each including an electro-optical device, a writing transistor for writing an image signal into the pixel, a driving transistor configured to drive the electro-optical device based on the image signal written by the writing transistor, a first switching transistor connected in series to the driving transistor and configured to control the electro-optical device to emit light or no light, a holding capacitor having a first terminal connected to a gate terminal of the driving transistor, and a second switching transistor connected to a second terminal of the holding capacitor and a source electrode of the driving transistor, a first scanning section configured to drive the writing transistor in a unit of a row of the pixels, a second scanning section configured to drive the switching transistors in synchronism with scanning by the first scanning section, and a third scanning section configured to control the second switching transistors to a non-conducting state within a period after the image signal is written by the writing transistor until the signal writing period of the same row of the pixels ends but to a conducting state within any other period.

In the display apparatus, if leak occurs with the first switching transistor within a signal writing period by the writing transistor, then the leak causes the source node of the driving transistor to be charged, and consequently, the source potential of the driving transistor rises. However, since the second switching transistor is placed into a non-conducting state to electrically disconnect the second terminal of the holding capacitor from the source node of the driving transistor, the held voltage of the holding capacitor is influenced, as an influence of the rise of the source potential within the signal writing period, only by an amount corresponding to the rise amount of the source potential till a point of time at which the switching transistor is placed into a non-conducting state.

Then, when the signal writing period comes to an end and the second switching transistor is placed into a conducting state to electrically connect the second terminal of the holding capacitor to the source node of the driving transistor, the source potential of the driving transistor which has risen by the leak during the signal writing period is pulled back by the charge held in the holding capacitor. Therefore, even if the source potential of the driving transistor rises due to leak of the first switching transistor within the signal writing period, at the end of the signal writing period, the source potential of the driving transistors returns, by an action of the second switching transistor, to a potential proximate to the potential at a point of time before the signal writing period is started. Therefore, reduction of the gate-source voltage of the driving transistor which may be caused by leak can be minimized.

With the display apparatus, even if leak occurs with the switching transistor for controlling the electro-optical device between light emission and no-light emission within a signal writing period, since reduction of the gate-source voltage of the driving transistor caused by the leak can be suppressed low, drop of the light emission luminance arising from the leak within the signal writing period can be suppressed.

The above and other features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 9A and 9B show an appearance of a digital camera to which the present invention is applied, and wherein FIG. 9A is a perspective view as viewed from the front side and FIG. 9B is a perspective view as viewed from the rear side;

FIGS. 12A to 12G show an appearance of a portable telephone set to which the present invention is applied, and wherein FIGS. 12A and 12B are a front elevational view and a side elevational view, respectively, of the portable telephone set in an open state, and FIGS. 12C, 12D, 12E, 12F and 12G are a front elevational view, a left side elevational view, a right side elevational view, a top plan view and a bottom plan view, respectively, of the portable telephone set in a closed state.

DETAILED DESCRIPTION OF THE PREFERRED EMBODIMENT

Figure 1:
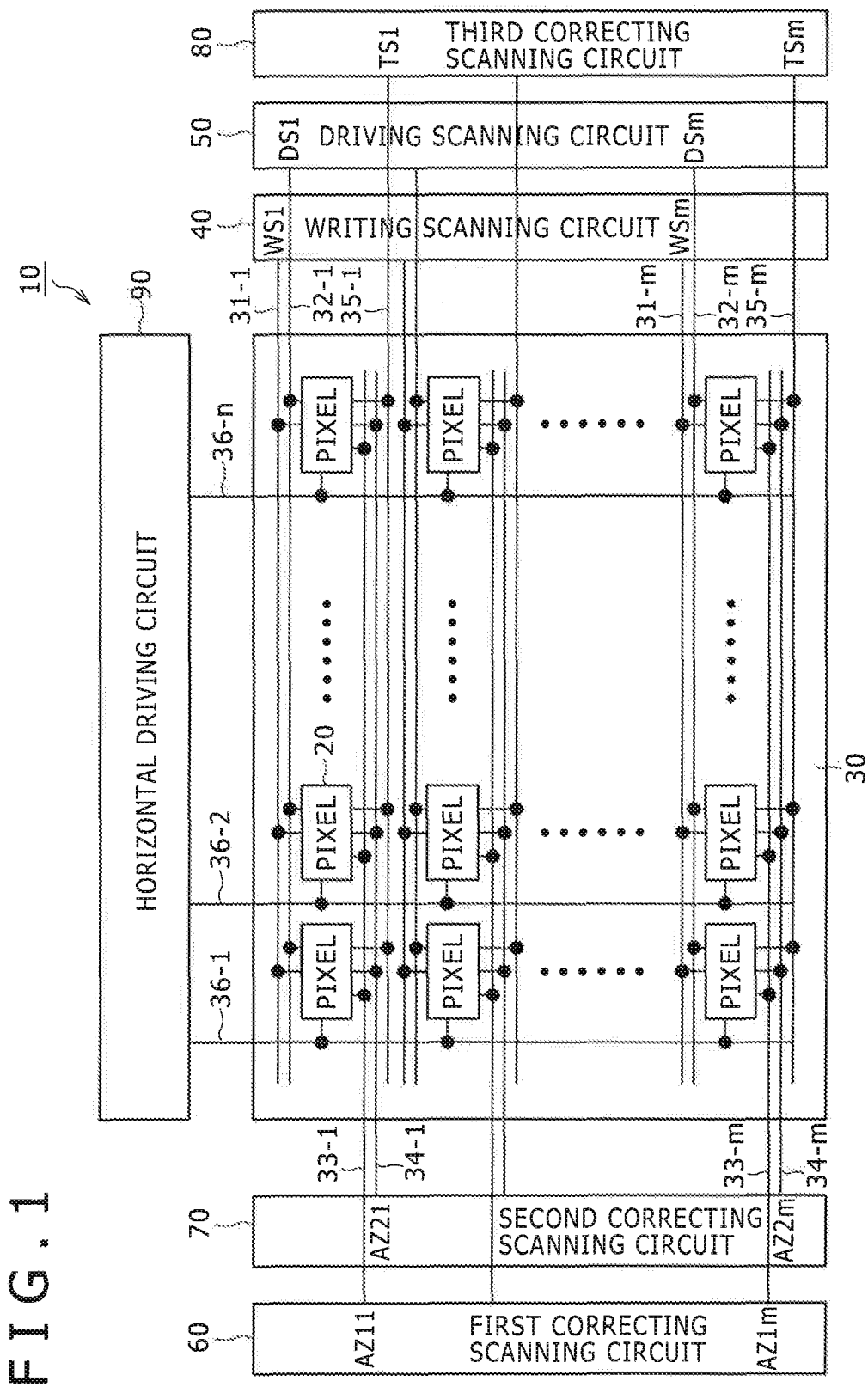
FIG. 1 is a block diagram showing a general configuration of an organic EL display apparatus to which an embodiment of the present invention is applied.

Referring first to FIG. 1, there is shown a general configuration of an active matrix type display apparatus to which the present invention is applied. The active matrix type display apparatus shown is formed as an active matrix type organic EL display apparatus which uses an electro-optical device of the current-driven type whose light emission luminance varies in response to the value of current flowing to the device, such as an organic EL device as a light emitting device of a pixel.

Referring to FIG. 1, the organic EL display apparatus 10 according to the present embodiment includes a pixel array section 30 wherein a plurality of pixels 20 are disposed two-dimensionally in rows and columns, that is, in a matrix, and a driving section disposed around the pixel array section 30 for driving the pixels 20. Then driving section for the pixels 20 includes, for example, a writing scanning circuit 40, a driving scanning circuit 50, first, second and third correcting scanning circuits 60, 70 and 80, and a horizontal driving circuit 90.

The pixel array section 30 is usually formed on a transparent insulating substrate such as a glass substrate and has a flat type panel structure. In the pixel array section 30, the pixels 20 are arrayed in rows and n columns, and for the pixel array, scanning lines 31-1 to 31-m, driving lines 32-1 to 32-m and first, second and third correcting scanning lines 33-1 to 33-m, 34-1 to 34-m and 35-1 to 35-m are wired for the individual pixel rows. Further, signal lines (data lines) 36-1 to 36-n are wired for the individual pixel column.

Each of the pixels 20 of the pixel array section 30 can be formed using an amorphous silicon TFT (Thin Film Transistor) or a low-temperature silicon TFT. Where a low-temperature silicon TFT is used, the writing scanning circuit 40, driving scanning circuit 50, first, second and third correcting scanning circuits 60, 70 and 80 and horizontal driving circuit 90 can be mounted on the display panel or substrate on which the pixel array section 30 is formed.

The writing scanning circuit 40 is formed from a shift register or the like and successively supplies, upon writing of an image signal into the pixels 20 of the pixel array section 30, writing signals (scanning signals) WS1 to WSm to the scanning lines 31-1 to 31-m to scan the pixels 20 in order in a unit of a row (line sequential scanning).

The driving scanning circuit 50 is formed from a shift register or the like and successively supplies, upon light emission driving of the pixels 20, driving signals DS1 to DSm to the driving lines 32-1 to 32-m in synchronism with scanning by the writing scanning circuit 40.

The first, second and third correcting scanning circuits 60, 70 and 80 are each formed from a shift register or the like and suitably supply, when correction operation hereinafter described is to be executed, first, second and third correcting scanning signals AZ11 to AZ1m, AZ21 to AZ2m and TS1 to TSm to the first correcting scanning lines 33-1 to 33-m, 34-1 to 34-m and 35-1 to 35-m, respectively.

The horizontal driving circuit 90 supplies a signal voltage Vsig of an image signal according to luminance information to the signal lines 36-1 to 36-n in synchronism with scanning by the writing scanning circuit 40. The horizontal driving circuit 90 adopts a driving form of line sequential writing by which, for example, the signal voltage Vsig is written in a unit of a row or line.

(Pixel Circuit)

Figure 2:
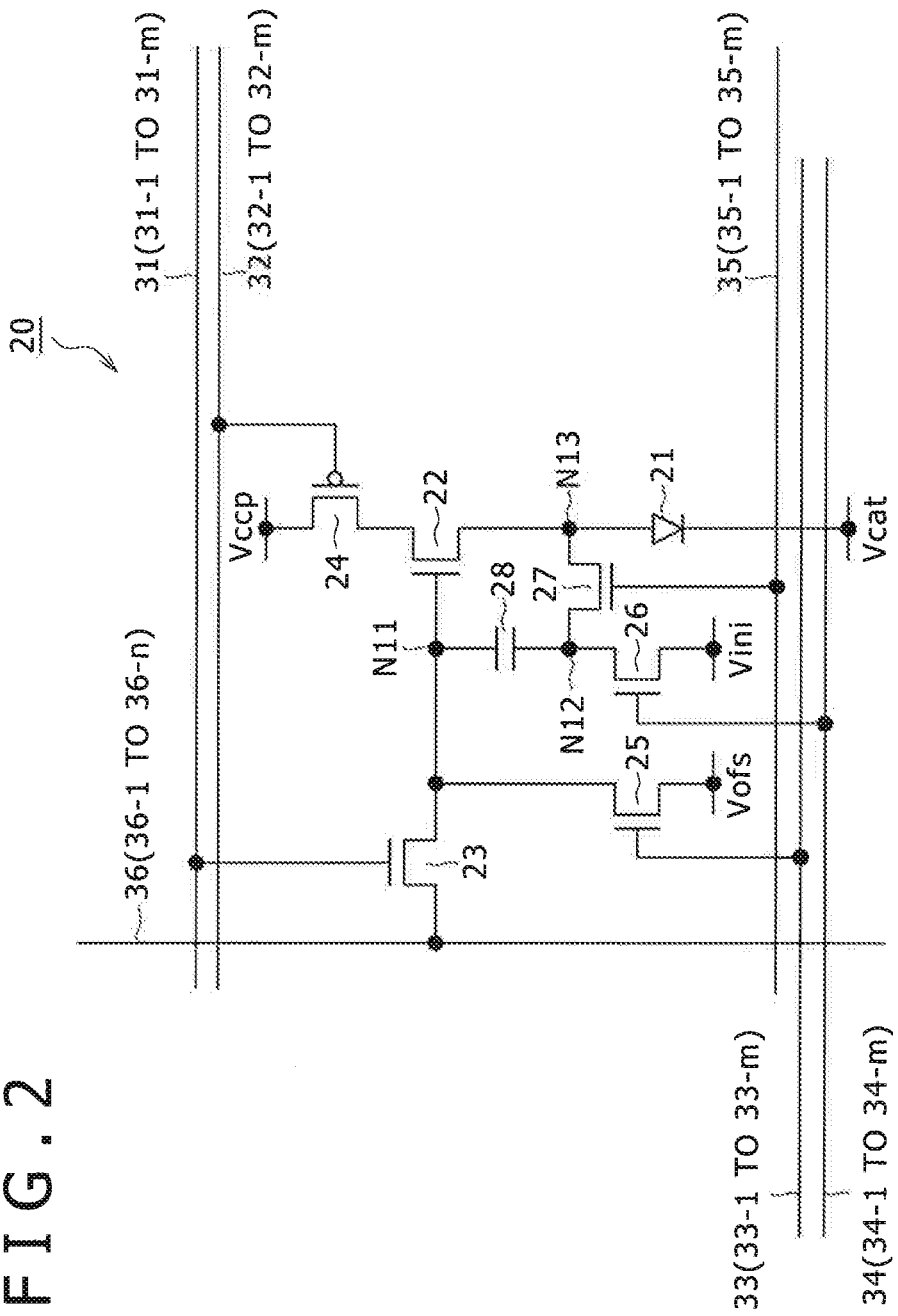
FIG. 2 is a circuit diagram showing an example of a particular configuration of a pixel or pixel circuit of the organic EL display apparatus.

FIG. 2 shows an example of a particular configuration of a pixel (pixel circuit) 20.

Referring to FIG. 2, the pixel 20 includes an electro-optical device of the current driven type which varies the light emission luminance in response to the value of current flowing to the device, for example, an organic EL device 21, as a light emitting device. The pixel 20 has a pixel configuration which includes, in addition to the organic EL device 21, a driving transistor 22, a writing (sampling) transistor 23, switching transistors 24 to 27 and a holding capacitor 28 as component devices thereof. In other words, the pixel 20 has a 6-Tr/1-C pixel configuration including six transistors (Tr) and one capacitance device (C).

In the pixel 20 having the configuration described above, an N-channel type TFT is used for the driving transistor 22, writing transistor 23 and switching transistors 25, 26 and 27, and a P-channel type TFT is used as the switching transistor 24. However, the combination of the conduction types of the driving transistor 22, writing transistor 23 and switching transistors 24 to 27 is a mere example, but the combination of the conduction types is not limited to this specific combination.

The organic EL device 21 is connected at the cathode electrode thereof to a first power supply potential Vcat (here, the ground potential GND). The driving transistor 22 is an active device for current driving the organic EL device 21 and is connected at the source electrode thereof to the anode electrode of the organic EL device 21 to form a source follower circuit.

The writing transistor 23 is connected at one electrode thereof such as the source electrode or the drain electrode thereof to a signal line 36 (36-1 to 36-n) and at anther one of the electrode such as the drain electrode or the source electrode to the gate electrode of the driving transistor 22. Further, the writing transistor 23 is connected at the gate electrode thereof to a driving line 31 (31-1 to 31-m).

The switching transistor 24 is connected at the source electrode thereof to a second power supply potential Vccp which here is a positive power supply potential and at the drain electrode thereof to the drain electrode of the driving transistor 22. Further, the switching transistor 24 is connected at the gate electrode thereof to a driving line (32-1 to 32-*m*).

The switching transistor 25 is connected at the drain electrode thereof to the other electrode of the writing transistor 23, that is, the gate electrode of the driving transistor 22, and at the source electrode thereof to a third power supply potential Vofs. The switching transistor 25 is connected at the gate electrode thereof to a first correcting scanning line 33 (33-1 to 33-*m*).

The holding capacitor 28 is connected at a first terminal thereof to a connection node N11 between the gate electrode of the driving transistor 22 and the drain electrode of the writing transistor 23. The switching transistor 26 is connected at the drain electrode thereof to a second terminal of the holding capacitor 28 and at the source electrode thereof to a fourth power supply potential Vini which here is a negative power supply potential. Further, the switching transistor 26 is connected at the gate electrode thereof to a second correcting scanning line (34-1 to 34-*m*).

The switching transistor 27 is connected at one electrode thereof, that is, at the drain electrode or the source electrode thereof, to a connection node N12 between the second terminal of the holding capacitor 28 and the drain electrode of the switching transistor 26. Further, the switching transistor 27 is connected at the other electrode thereof, that is, at the source electrode or the drain electrode thereof, to a connection node N13 between the source electrode of the driving transistor 22 and the anode electrode of the organic EL device 21. Further, the switching transistor 27 is connected at the gate electrode thereof to a third correcting scanning line 35 (35-1 to 35-*m*).

In the pixel 20 wherein the components are connected in such a connection scheme as described above, the components act in the following manner.

When the writing transistor 23 is placed into a conducting or ON state, it samples the signal voltage Vsig of an image signal supplied thereto through the signal line 36 and writes the sampled signal voltage Vsig into the pixel 20. The signal voltage Vsig written by the writing transistor 23 is applied to the gate electrode of the driving transistor 22 and is held in the holding capacitor 28.

When the switching transistor 24 is in a conducting state, the driving transistor 22 receives supply of current from the second power supply potential Vccp and supplies driving current of a current value defined by the voltage value of the signal voltage Vsig held in the holding capacitor 28 to the organic EL device 21 to drive the organic EL device 21 (current driving).

The driving transistor 22 operates as a constant current source because it is designed so as to operate in a saturation region. As a result, fixed drain-source current Ids given by the following expression (1) is supplied from the driving transistor 22 to the organic EL device 21:

$$Ids = (1/2) \cdot \mu (W/L) Cox (Vgs - Vth)^2 \quad (1)$$

where Vth is the threshold voltage of the driving transistor 22, μ the mobility of the semiconductor thin film which composes the channel of the driving transistor 22 (the mobility is hereinafter referred to as mobility of the driving transistor 22), W the channel width, L the channel length, Cox the gate capacitance per unit area, and Vgs the gate-source voltage applied to the gate with reference to the source potential.

When the switching transistor 24 is placed into a conducting state, it supplies current from the second power supply potential Vccp to the driving transistor 22. In particular, the switching transistor 24 controls supply of current to the driving transistor 22 to control the period of light emission/no-light emission of the organic EL device 21 to carry out duty driving.

When the switching transistors 25 and 26 are suitably placed into a conducting state, the threshold voltage Vth of the driving transistor 22 is detected prior to current driving of the organic EL device 21, and the detected threshold voltage Vth is held in advance into the holding capacitor 28 in order to cancel the influence of the same. The holding capacitor 28 holds the potential difference between the gate and the source of the driving transistor 22 over a display period.

The switching transistor 27 electrically disconnects the connection node N12 and the connection node N12 from each other for a period after the signal voltage Vsig of an image signal is written until the signal writing period of the same pixel row ends to carry out action of suppressing drop of the light emission luminance arising from leak from the switching transistor 24 even if the leak occurs.

As a condition for assuring normal operation of the pixel 20, the fourth power supply potential Vini is set so as to be lower than a potential of the difference of the threshold voltage Vth of the driving transistor 22 from the third power supply potential Vofs. In other words, the level relationship of Vini<Vofs−Vth is satisfied.

Further, the level of the addition of the threshold voltage Vthel of the organic EL device 21 to the first power supply potential Vcat (here, the ground potential GND) of the organic EL device 21 is set so as to be higher than the level of the difference of the threshold voltage Vth of the driving transistor 22 from the third power supply potential Vofs. In other words, the level relationship of Vcat+Vthel>Vofs−Vth (>Vini) is satisfied.

(Pixel Structure)

Figure 3:
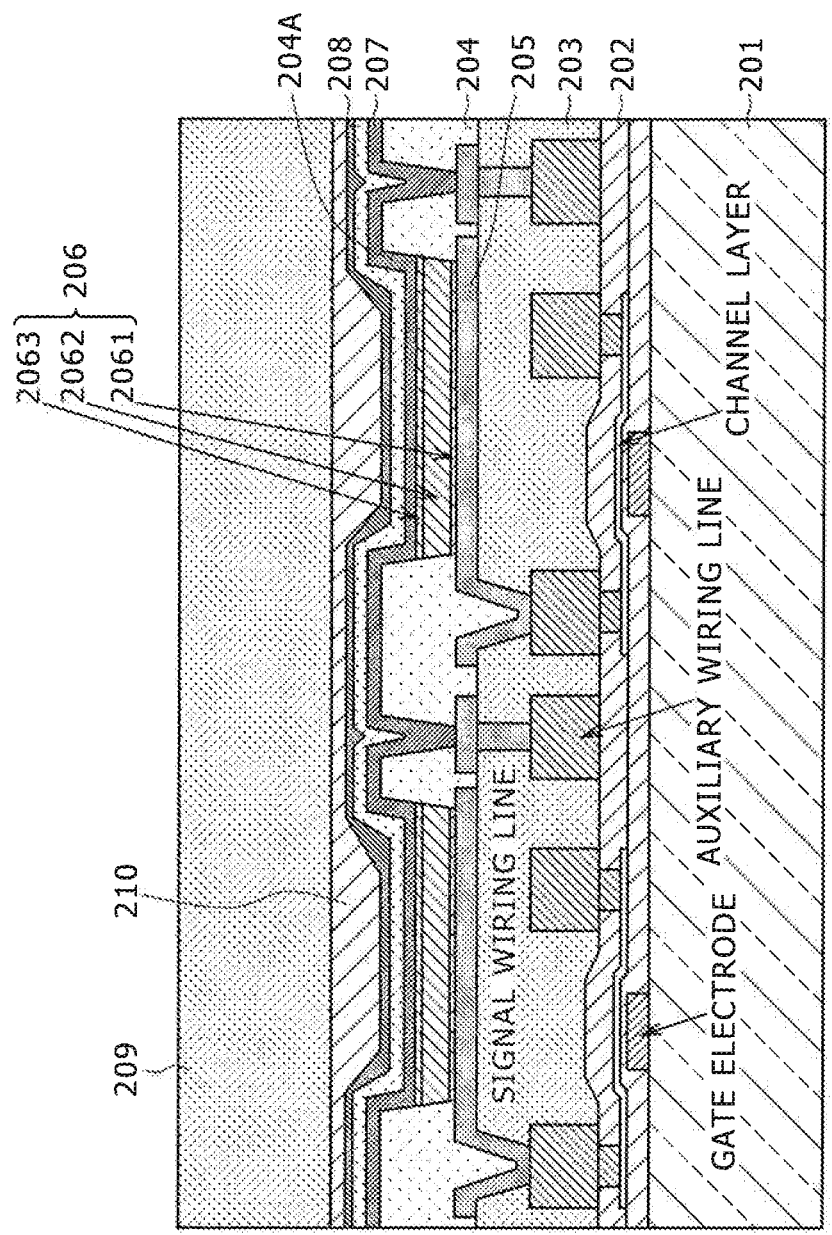
FIG. 3 is a sectional view showing an example of a sectional structure of the pixel.

FIG. 3 shows an example of a sectional structure of the pixel 20. Referring to FIG. 3, the pixel 20 includes an insulating film 202, an insulating flattening film 203 and a wind insulating film 204 formed in order on a glass substrate 201 on which the pixel circuits including the driving transistor 22 and writing transistor 23 are formed. Further, an organic EL device 21 is provided in each recessed portion 204A of the wind insulating film 204.

The organic EL device 21 includes an anode electrode 205 made of a metal material and formed at a bottom portion of the recessed portion 204A of the wind insulating film 204, and an organic layer 206 formed on the anode electrode 205 and including an electron transport layer, a light emitting layer, and a hole transport layer/hole injection layer. The organic EL device 21 further includes a cathode electrode 207 formed from a transparent conductive film or the like formed commonly to all pixels on the organic layer 206.

In the organic EL device 21, the organic layer 206 is formed by successively depositing a hole transport layer/hole injection layer 2061, a light emitting layer 2062, an electron transport layer 2063 and an electron injection layer (not shown) on the anode electrode 205. When the pixel 20 is current driven by the driving transistor 22 shown in FIG. 2, current flows from the driving transistor 22 to the organic layer 206 through the anode electrode 205, whereupon electrons and holes re-couple in the light emitting layer 2062 in the organic layer 206 thereby to emit light.

After the organic EL device 21 is formed in a unit of a pixel on the glass substrate 201, on which the pixel circuits are formed, through the insulating film 202, insulating flattening film 203 and wind insulating film 204 as seen in FIG. 3, the sealing substrate 209 is bonded to a passivation film 208 by bonding agent 210 to seal the organic EL device 21 with the sealing substrate 209 to form a display panel.

With the configuration of the pixel 20 described above, in the present embodiment, it includes the switching transistor 27 connected between the connection node N12 (second terminal of the holding capacitor 28) and the connection node N13 (source electrode of the driving transistor 22/anode electrode of the organic EL device 21). Incidentally, in the pixel configuration according to the related art disclosed in Patent Document 1 mentioned hereinabove, the connection node N12 and the connection node N13 are electrically connected to each other.

[Basic Circuit Operation]

Figure 4:
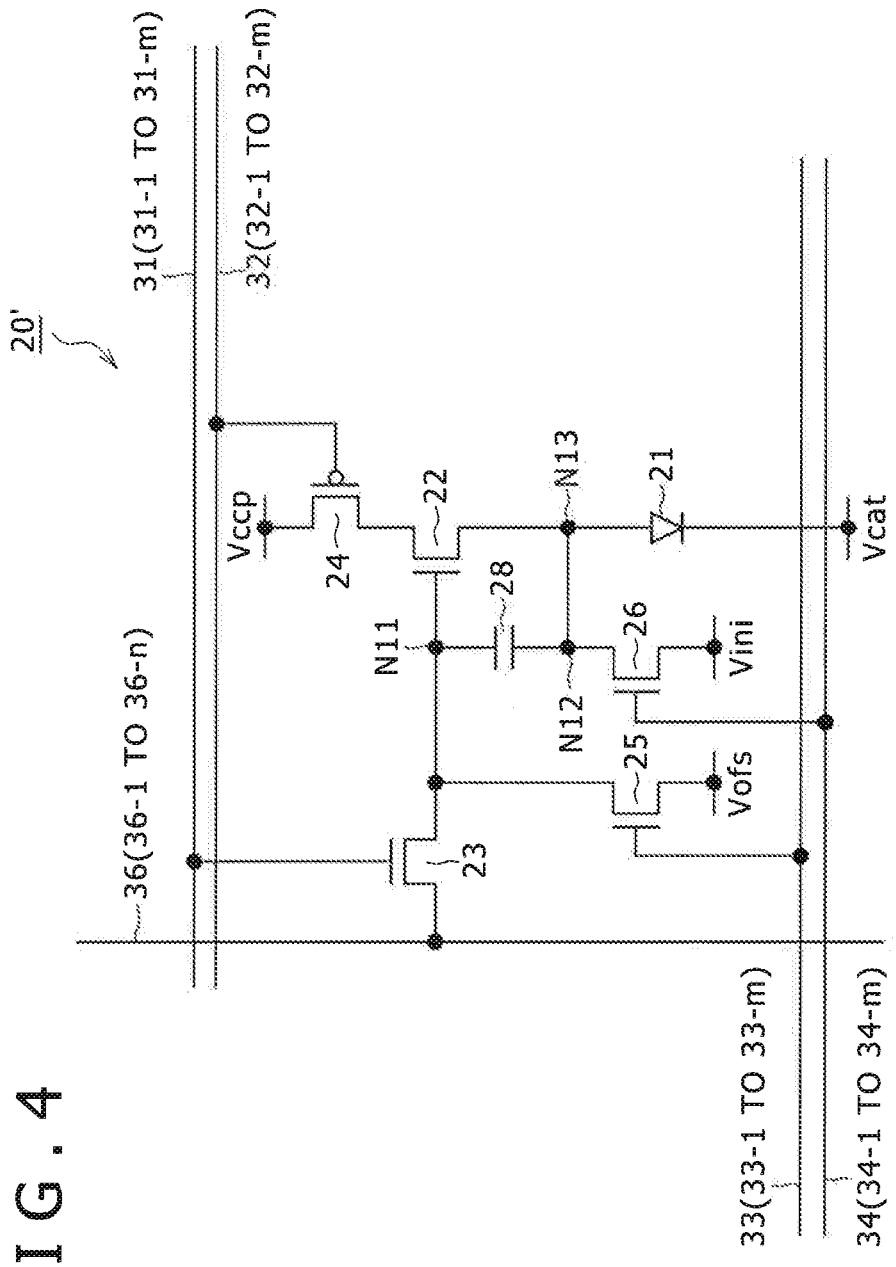
FIG. 4 is a circuit diagram showing an example of a configuration of a pixel in the past.

Here, basic circuit operation of an active matrix type organic EL display apparatus which includes a pixel 20' according to the related art which does not include the switching transistor 27 while the second terminal of the holding capacitor 28 and the source electrode of the driving transistor 22 anode electrode of the organic EL device 21 are electrically connected to each other as seen in FIG. 4 is described with reference to FIG. 5.

Figure 5:
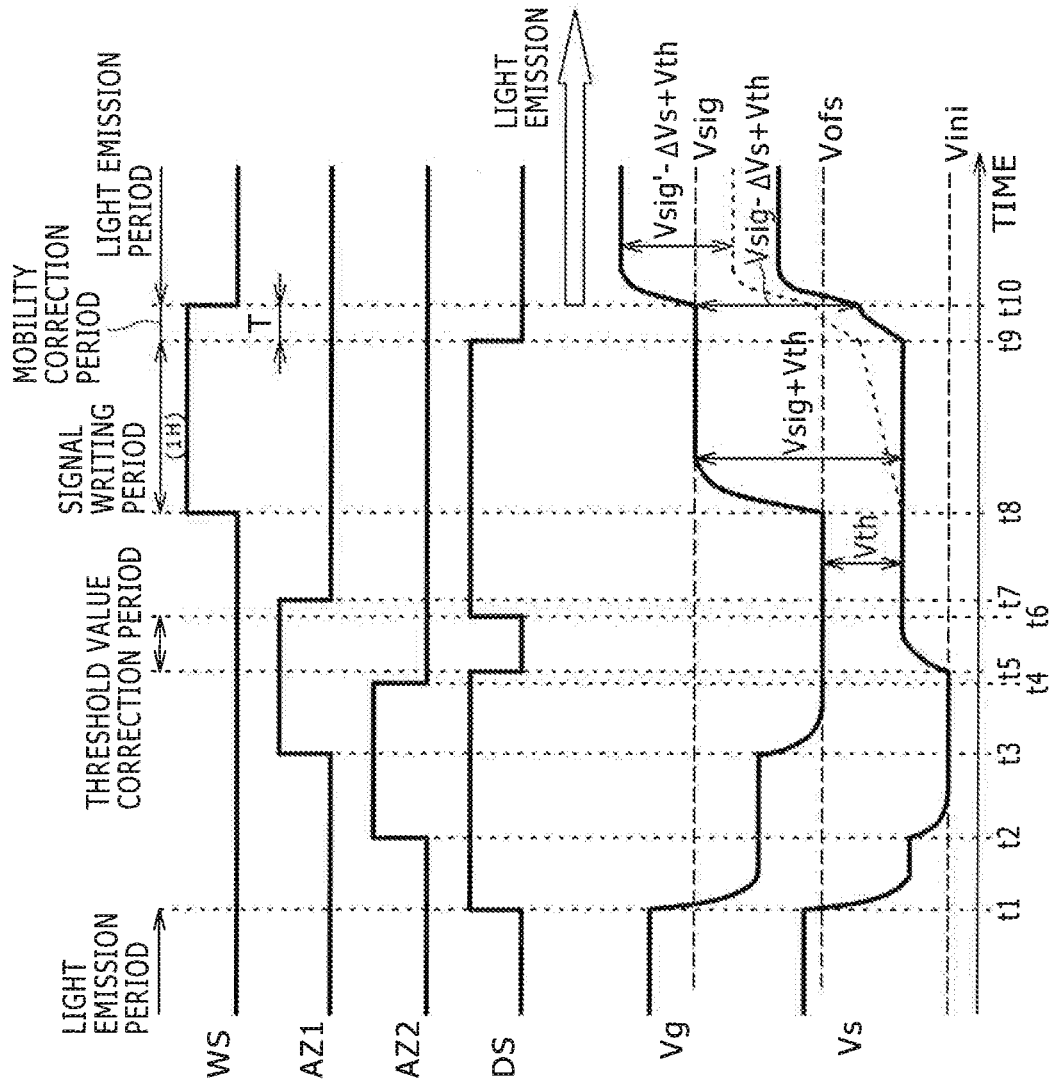
FIG. 5 is a timing waveform diagram illustrating basic circuit operation of an organic EL display apparatus which includes the pixel in the past.

FIG. 5 illustrates basic circuit operation when the pixels 20 in a certain pixel row are driven. In particular, FIG. 5 illustrates a timing relationship among a writing signal WS (WS1 to WSm) provided from the writing scanning circuit 40 to the pixels 20, a driving signal DS (DS1 to DSm) provided from the driving scanning circuit 50 to the pixels 20 and first and second correcting scanning signals AZ1 (AZ11 to AZ1m) and AZ2 (AZ21 to AZ2m) provided from the first and second correcting scanning circuits 60 and 70 to the pixels 20. FIG. 5 further illustrates variations of the gate potential Vg and the source potential Vs of the driving transistor 22.

Here, since the writing transistor 23 and the switching transistors 25 and 26 are of the N-channel type, the high level (in the present example, the second power supply potential Vccp, hereinafter referred to as "H level") state of the writing signal WS and the first and second correcting scanning signals AZ1 and AZ2 is an active state whereas the low level (in the present example, the first power supply potential Vcat (GND); hereinafter referred as "L level") state is an inactive state. On the other hand, since the switching transistor 24 is of the P-channel type, the L level state of the driving signal DS is an active state, and the H level state is an inactive state.

The level of the driving signal DS changes from the L level to the H level at time t1, and the switching transistor 24 is placed into a non-conducting or OFF state. In this state, the level of the second correcting scanning signal AZ2 changes from the L level to the H level at time t2, and the switching transistor 26 is placed into a conducting state. Consequently, the fourth power supply potential Vini is applied to the source electrode of the driving transistor 22 through the switching transistor 26.

At this time, since the level relationship of Vini<Vcat+ Vthel is satisfied as described hereinabove, the organic EL device 21 is in a reversely biased state. Accordingly, no current flows to the organic EL device 21, and the organic EL device 21 is in a no-light emitting state.

Then at time t3, the level of the first correcting scanning signal AZ1 changes from the L level to the H level, and the switching transistor 25 is placed into a conducting state. Consequently, the third power supply potential Vofs is applied to the gate electrode of the driving transistor 22 through the switching transistor 25. At this time, the gate-source voltage Vgs of the driving transistor 22 assumes the value of Vofs−Vini. Here, the level relationship of Vofs−Vini>Vth is satisfied as described above.

(Threshold Value Correction Period)

Then, the level of the second correcting scanning signal AZ2 changes from the H level to the L level and the switching transistor 26 is placed into a non-conducting state at time t4. Thereafter, the level of the driving signal DS changes from the H level to the L level and the switching transistor 24 is placed into a conducting state at time t5. Consequently, current according to the gate-source voltage Vgs flows to the driving transistor 22.

At this time, the first power supply potential Vcat of the organic EL device 21 is higher than the source potential Vs of the driving transistor 22, and the organic EL device 21 is in a reversely biased state. Consequently, current flowing to the driving transistor 22 flows along a path of the connection node N13→connection node N12→holding capacitor 28→connection node N11→switching transistor 25→third power supply potential Vofs. Therefore, charge according to the current is charged into the holding capacitor 28. Further, together with the charging of the holding capacitor 28, the source potential Vs of the driving transistor 22 gradually rises from the fourth power supply potential Vini as time passes.

Then, after a fixed interval of time passes and the gate-source voltage Vgs of the driving transistor 22 becomes equal to the threshold voltage Vth of the driving transistor 22, the driving transistor 22 is cut off. Consequently, current does not flow to the driving transistor 22 any more. Therefore, the gate-source voltage Vgs of the driving transistor 22, that is, the threshold voltage Vth, is held as a potential for threshold value correction to the holding capacitor 28.

Thereafter, the level of the driving signal DS changes from the L level to the H level and the switching transistor 24 is placed into a non-conducting state at time t6. The period from time t5 to time t6 is a period of time within which the threshold voltage Vth of the driving transistor 22 is detected and held into the holding capacitor 28. The fixed period t5-t6 is hereinafter referred to as threshold value correction period for the convenience of description. Thereafter, the level of the first correcting scanning signal AZ1 changes from the H level to the L level and the switching transistor 25 is placed into a non-conducting state at time t7.

(Signal Writing Period)

Then at time t8, the level of the writing signal WS changes from the L level to the H level and the writing transistor 23 is placed into a conducting state. Consequently, the signal voltage Vsig of the image signal is sampled by the writing transistor 23 and is written into the pixels. Therefore, the gate potential Vg of the driving transistor 22 becomes equal to the signal voltage Vsig. This signal voltage Vsig is held by the holding capacitor 28.

At this time, the source potential Vs of the driving transistor 22 rises with respect to the amplitude of the gate potential Vg of the driving transistor 22 upon sampling by the writing transistor 23 by the capacitive coupling between the holding capacitor 28 and the organic EL device 21.

Here, where the capacitance value of the holding capacitor 28 is represented by Ccs, the capacitance value of the organic EL device 21 by Coled and the rise amount of the gate potential Vg of the driving transistor 22 by ΔVg, the rise amount ΔVs of the source potential Vs of the driving transistor 22 is given by the following expression (2):

$$\Delta Vs = \Delta Vg \times \{Ccs/(Coled+Ccs)\} \quad (2)$$

On the other hand, the signal voltage Vsig written by sampling by the writing transistor 23 is held into the holding capacitor 28 in a manner wherein it is added to the threshold voltage Vth held in the holding capacitor 28. At this time, the held voltage of the holding capacitor 28 is Vsig−Vofs+Vth. Here, if Vofs=0 V is assumed to facilitate understanding, then the gate-source voltage Vgs is Vsig+Vth.

By holding the threshold voltage Vth in the holding capacitor 28 in advance in this manner, it is possible to correct the dispersion or the age variation of the threshold voltage Vth for each pixel of the driving transistor 22. In particular, when the driving transistor 22 is driven by the signal voltage Vsig, the threshold voltage Vth of the driving transistor 22 is canceled by the threshold voltage Vth held in the holding capacitor 28. In other words, correction of the threshold voltage Vth is carried out.

Even if there is a dispersion or age variation of the threshold voltage Vth for each pixel, the influence of the threshold voltage Vth on driving of the organic EL device 21 by the driving transistor 22 can be canceled by the correction operation of the threshold voltage Vth. As a result, the light emission luminance of the organic EL device 21 can be kept fixed without being influenced by the dispersion or the age variation of the threshold voltage Vth for each pixel.

(Mobility Correction Period)

Thereafter, while the writing transistor 23 remains in a conducting state, the level of the driving signal DS changes from the H level to the L level and the switching transistor 24 is placed into a conducting state at time t9. When the switching transistor 24 is placed into a conducting state, supply of current from the power supply potential Vccp to the driving transistor 22 is started. Here, since the condition of Vofs−Vth<Vthel is set, the organic EL device 21 is placed into a reversely biased state.

Since the organic EL device 21 is in a reversely biased state, the organic EL device 21 indicates not a diode characteristic but a simple capacitor characteristic. Accordingly, the drain-source current Ids flowing through the driving transistor 22 is written into a combined resistor C (=Ccs+Coled) of the capacitance value Ccs of the holding capacitor 28 and the capacitance value Coled of the capacitance component of the organic EL device 21. As a result of the writing, the source potential Vs of the driving transistor 22 rises.

The rise amount ΔVs of the source potential Vs of the driving transistor 22 acts so as to be subtracted from the gate-source voltage Vgs held in the holding capacitor 28, or in other words, so as to discharge the charge of the holding capacitor 28. Therefore, negative feedback is applied. In other words, the rise amount ΔVs of the source potential Vs of the driving transistor 22 is a negative feedback amount in the negative feedback. At this time, the gate-source voltage Vgs of the driving transistor 22 is Vsig−ΔVs+Vth.

By negatively feeding back current (drain-source current Ids) flowing through the driving transistor 22 to the gate input (gate-source potential difference) of the driving transistor 22 in this manner, the dependency of the drain-source current Ids of the driving transistor 22 in each pixel 20 upon the mobility μ is canceled. In other words, it is possible to correct the dispersion of the mobility μ of the driving transistor 22 for each pixel.

In FIG. 5, a period (t9-t10) within which an active period, that is, an H level period, of the writing signal WS and an active period, that is, an L level period, of the driving signal DS overlap with each other, that is, an overlap period T within which both of the writing transistor 23 and the switching transistor 24 exhibit a conducting state, is a mobility correction period.

Here, if a driving transistor having a relatively high mobility μ and another driving transistor having a relatively low mobility μ are considered, then the source potential Vs of the driving transistor having the high mobility μ rises by a greater amount than the driving transistor having the low mobility μ within the overlap period T. Further, as the source potential Vs increases by a greater amount, the gate-source voltage Vgs of the driving transistor 22 decreases and less current is likely to flow.

In other words, by adjusting the overlap period T, the same drain-source current Ids can be provided to the driving transistors 22 having different values of the mobility μ. The gate-source voltage Vgs of each driving transistor 22 determined within the overlap period T is held by the holding capacitor 28, and the driving transistor 22 supplies current according to the gate-source voltage Vgs, that is, drain-source current Ids, to the organic EL device 21 so that the organic EL device 21 emits light.

(Light Emission Period)

Since the level of the writing signal WS becomes the L level and the writing transistor 23 is placed into a non-conducting state at time t10, the overlap period T ends and a light emission period is entered. Within the light emission period, the source potential Vs of the driving transistor 22 rises up to the driving voltage of the organic EL device 21. Further, since the gate electrode of the driving transistor 22 is disconnected from the signal line 36 (36-1 to 36-n) and placed into a floating state, also the gate potential Vg rises in an interlocking relationship with the rise of the source potential Vs by a bootstrap operation by the holding capacitor 28.

At this time, where the parasitic capacitance of the gate electrode of the driving transistor 22 is represented by Cg, the rise amount ΔVg of the gate potential Vg is given by the following expression (3):

$$\Delta Vg = \Delta Vs \times \{Ccs/(Ccs+Cg)\} \quad (3)$$

Meanwhile, the gate-source voltage Vgs held in the holding capacitor 28 keeps the value of Vsig−ΔVs+Vth.

Then, together with the rise of the source potential Vs of the driving transistor 22, the reversely biased state of the organic EL device 21 is canceled and a forwardly biased state is established. Consequently, since the fixed drain-source current Ids given by the expression (1) given hereinabove is supplied from the driving transistor 22 to the organic EL device 21, the organic EL device 21 actually begins to emit light.

The relationship between the drain-source current Ids and the gate-source voltage Vgs is given, by substituting Vsig−ΔVs+Vth into Vgs of the expression (1) given hereinabove, by the following expression (4):

$$Ids = k\mu(Vgs - Vth)^2 \quad (4)$$
$$= k\mu(Vsig - \Delta Vs)^2$$

where k=(½)(W/L)Cox.

As can be recognized from the expression (4) above, the term of the threshold voltage Vth of the driving transistor 22 is canceled. Therefore, it can be recognized that the drain-source current Ids to be supplied from the driving transistor 22 to the organic EL device 21 does not rely upon the threshold voltage Vth of the driving transistor 22. Basically, the drain-source current Ids of the driving transistor 22 depends upon the signal voltage Vsig of the image signal. In other words, the organic EL device 21 emits light with a luminance according to the signal voltage Vsig without being influenced by the dispersion or the age variation of the threshold voltage Vth for each pixel of the driving transistor 22.

By holding the threshold voltage Vth of the driving transistor 22 into the holding capacitor 28 in advance before the signal voltage Vsig of the image signal is written in this manner, it is possible to cancel or correct the threshold voltage Vth of the driving transistor 22 and supply the fixed drain-source current Ids, which is not influenced by the dispersion or age variation of the threshold voltage Vth for each pixel. Therefore, a display image of high picture quality can be obtained (compensation function for the variation of the threshold voltage Vth of the driving transistor 22).

Further, as can be recognized from the expression (4) given hereinabove, the signal voltage Vsig of the image signal is corrected with the feedback amount $\Delta$Vs by negative feedback of the drain-source current Ids to the gate input of the driving transistor 22. This feedback amount $\Delta$Vs acts so as to cancel the effect of the mobility $\mu$ positioned at the coefficient part of the expression (4).

Accordingly, the drain-source current Ids substantially relies only upon the signal voltage Vsig of the image signal. In other words, the organic EL device 21 emits light with a luminance according to the signal voltage Vsig without being influenced not only by the threshold voltage Vth of the driving transistor 22 but also by the dispersion or the age variation of the mobility $\mu$ of the driving transistor 22 for each pixel. As a result, uniform picture quality free from a stripe or luminance irregularity can be obtained.

By negatively feeding back the drain-source current Ids to the gate input of the driving transistor 22 and correcting the signal voltage Vsig with the feedback amount $\Delta$Vs within the overlap period T (t9-t10) in this manner, it is possible to cancel the dependency of the drain-source current Ids of the driving transistor 22 upon the mobility $\mu$ and supply the drain-source current Ids, which relies only upon the signal voltage Vsig, to the organic EL device 21. Therefore, a display image of uniform picture quality free from a stripe or luminance irregularity arising from the dispersion or age variation of the mobility $\mu$ of the driving transistor 22 for each pixel can be obtained (compensation function for the mobility $\mu$ of the driving transistor 22).

Here, in the organic EL display apparatus 10 wherein the pixels 20 each including an organic EL device 21 which is an electro-optical device of the current driven type are disposed in a matrix, if the light emission time of an organic EL device 21 becomes long, then the I-V characteristic of the organic EL device 21 varies. Therefore, also the potential at the connection node N13 between the anode electrode of the organic EL device 21 and the source of the driving transistor 22 varies.

On the other hand, in the organic EL display apparatus 10 of the active matrix system having the configuration described above, since the gate-source voltage Vgs of the driving transistor 22 is kept at the fixed value, current which should flow through the organic EL device 21 does not flow. Accordingly, even if the I-V characteristic of the organic EL device 21 varies, since the fixed drain-source current Ids continues to flow to the organic EL device 21, the variation of the light emission period of the organic EL device 21 can be suppressed (compensation function for the characteristic variation of the organic EL device 21).

[Problems by Leak of a Switching Transistor]

Incidentally, if, within the signal writing period (t8-t9), the signal voltage Vsig is written into the gate electrode of the driving transistor 22 by writing by the writing transistor 23 and, when the signal voltage Vsig is held as the gate-source voltage Vgs of the driving transistor 22 in the holding capacitor 28, leak occurs with the switching transistor 24 because of failure in characteristic or the like, then a problem that the light emission luminance drops occurs. The reason of this is described in detail below.

A certain period of time is requisite for writing of the signal voltage Vsig of the image signal. Particularly, according to a selector movement system (time divisional driving system) which is a kind of a driving system of the signal voltage Vsig of the image signal, since it is necessary to write signal voltages VsigR, VsigG and VsigB of R (red), G (green) and B (blue) within a signal writing period of the same pixel row, time is demanded for writing of the signal voltage.

Here, according to the selector driving system, a plurality of ones of the signal lines 36-1 to 36-n on the display panel are allocated in a unit or group to one of outputs of a driver IC (not shown) outside the panel and are successively selected time-divisionally while the signal voltage Vsig of the image signal to be outputted in a time series for each output of the driver IC is distributed time-divisionally to the selected signal line.

More particularly, according to the selector driving system, the relationship between the outputs of the driver IC and the signal lines 36-1 to 36-n on the display panel is set in a one to x (x is an integer equal to or higher than 2) corresponding relationship, and x signal lines allocated to one output of the driver IC are selected and driven x-time-divisionally.

As a particular example, it seems a possible idea to set x to x=3 as described above and set the image signal, which is to be outputted in time series from the driver IC, as repetitions of the three colors of R, G and B. By adopting this selector driving system, the number of outputs of the driver IC and the number of wiring lines between the driver IC and the display panel can be reduced to 1/x the number of signal lines.

If leak occurs with the switching transistor 24 within the signal writing period, then current flows from the second power supply potential Vccp to the driving transistor 22 through the switching transistor 24 due to the leak, and the source node (connection node N13) of the driving transistor 22 is charged by the current. Therefore, the source potential Vs of the driving transistor 22 rises as indicated by a broken line in FIG. 5.

At this time, as the signal wiring period within which the signal voltages VsigR, VsigG and VsigB of R, G and B are written as in the case of, for example, the selector driving system, that is, the signal writing period for the same pixel row, increases, the source potential Vs of the driving transistor 22 rises to a potential (Vg−Vth) lower by the threshold voltage Vth than the gate potential Vg of the driving transistor 22.

Consequently, if it is assumed that the gate-source voltage Vgs of the driving transistor 22 is equal among all pixels, then the gate-source voltage Vgs' of the driving transistor 22 of a pixel in which leak occurs with the switching transistor 24 becomes lower by a rise amount of the source potential Vs than the gate-source voltage Vgs of the other pixels.

Consequently, since the driving current to be supplied from the driving transistor 22 to the organic EL device 21 decreases, a problem that the light emission luminance decreases from that of the other pixels and the pixel becomes darker arises.

[Working-Effect of the Embodiment]

Against this problem, the organic EL display apparatus 10 according to the present embodiment is configured such that, as seen in FIG. 2, each pixel 20 includes a switching transistor 27 connected between the connection node N12 and the connection node N13 and carries out such driving that the switching transistor 27 is placed in a non-conducting state within a period after the signal voltage Vsig of an image signal is written by the pixel array section 30 (refer to FIG. 1) until the signal writing period of the same pixel row comes to an end.

By adopting such a configuration as described above, it is possible to suppress drop of the light emission luminance arising from leak of the switching transistor 24 through an action of the switching transistor 27. Here, the capacitance value Ccs of the holding capacitor 28 should be set higher than the capacitance value Coled of the organic EL device 21, preferably sufficiently higher than the capacitance value Coled.

Figure 6:
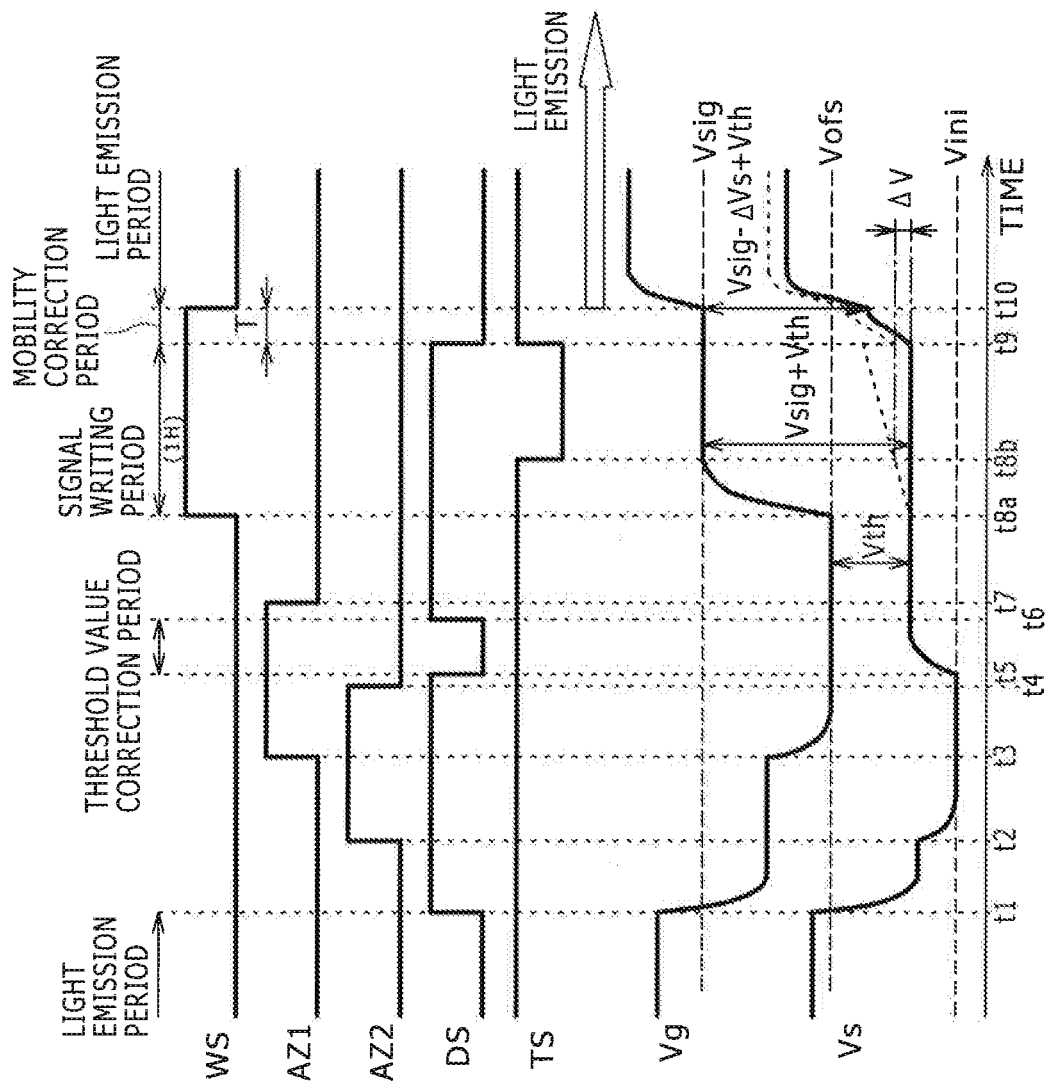
FIG. 6 is a timing waveform diagram illustrating circuit operation of the organic EL display apparatus of FIG. 1.

In the following, action of the switching transistor 27 is described more particularly with reference to FIG. 6.

Driving of the switching transistor 27 between conduction and non-conduction is carried out with a third correcting scanning signal Is (TS1 to TSm) outputted from the pixel array section 30. As seen from FIG. 6, the third correcting scanning signal Is exhibits the L level or inactive state within a period from time t8b after starting time t8a of the signal writing period to end time t9 of the signal writing period, but exhibits the H level or active state within any other period.

Here, the time t8b is time at which the period of time requisite to sufficiently write the signal voltage Vsig of the image signal elapses after start time t8a of the signal writing period.

Since the signal writing period is entered and the signal voltage Vsig of the image signal is written, the held voltage of the holding capacitor 28 becomes a value Vsig+Vth which is the sum of the signal voltage Vsig and the threshold voltage Vth of the driving transistor 22 held within the threshold value correction period.

Then, at time t8b at which the signal voltage Vsig of the image signal is written sufficiently, the level of the third correcting scanning signal Ts becomes the L level and the switching transistor 27 is placed into a non-conducting state. Consequently, the second terminal of the holding capacitor 28 is electrically disconnected from the source node of the driving transistor 22, that is, from the connection node N13.

Here, if leak occurs with the switching transistor 24 within the signal writing period, then current flows to the driving transistor 22 due to the leak and the source node of the driving transistor 22 is charged by the current as described above. Therefore, the source potential Vs of the driving transistor 22 rises.

However, since the second terminal of the holding capacitor 28 is electrically disconnected from the source node of the driving transistor 22, the held voltage Vsig+Vth of the holding capacitor 28 is influenced, as an influence of the rise of the source potential Vs within the signal writing period, only by the rise amount of the source potential Vs to time t8b at which the switching transistor 27 is placed into a non-conducting state.

Here, if the rise amount of the source potential Vs from time t8a to time t8b is represented by ΔV, then the held voltage of the holding capacitor 28 at time t8b is Vsig+Vth−ΔV. Then, within a period of time within which the switching transistor 27 remains in a non-conducting state, the holding capacitor 28 continues to hold the hold voltage Vsig+Vth−ΔV.

Then, if the switching transistor 27 is placed into a conducting state and the second terminal of the holding capacitor 28 is electrically connected to the source node of the driving transistor 22 at time t9, then the source potential Vs which has risen by leak within the signal writing period is pulled back to the potential of Vsig+Vth−ΔV by the charged having been held in the holding capacitor 28. Here, it is assumed that the capacitance value Ccs is sufficiently higher than the capacitance value Coled of the organic EL device 21.

Figure 7:
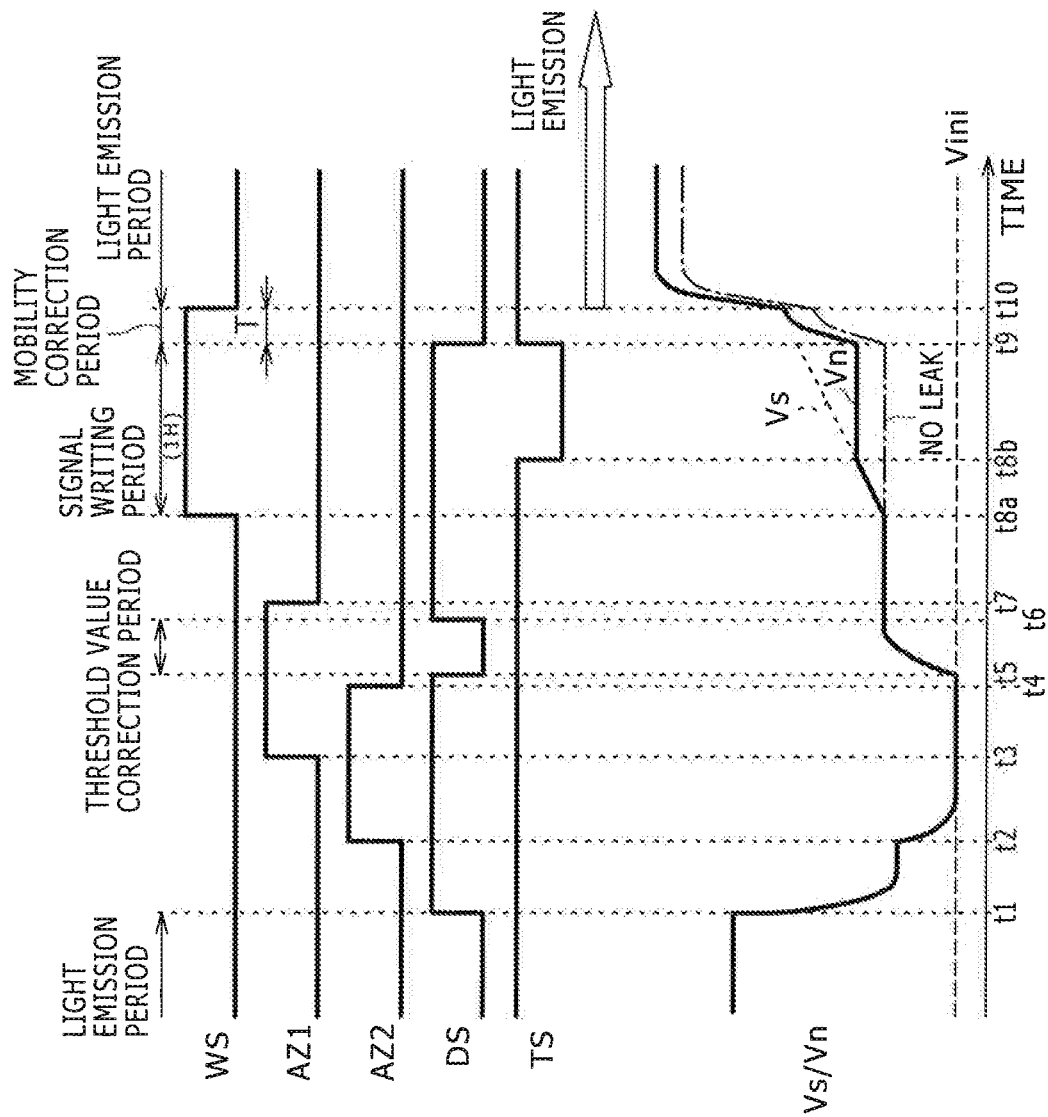
FIG. 7 is a timing waveform diagram illustrating a time variation of the source potential of a driving transistor and the node potential at a terminal of a holding capacitor of the organic EL display apparatus of FIG. 1.

FIG. 7 illustrates a time variation of the source potential Vs at the driving transistor 22 and the node potential Vn at the connection node N12 (second terminal of the holding capacitor 28). Referring to FIG. 7, a solid line of the waveform of the source potential Vs and the node potential Vn within the signal writing period indicates the node potential Vn, and a broken line indicates the source potential Vs. Meanwhile, an alternate long and short dash line indicates the source potential Vs and the node potential Vn where no leak is involved.

By the correction operation by the switching transistor 27, the gate-source voltage Vgs of the driving transistor 22 becomes Vsig+Vth−ΔV and approaches Vsig+Vth before the mobility correction period t9-t10 is entered. In particular, it is possible to suppress reduction of the gate-source voltage Vgs of the driving transistor 22 arising from leak to the minimum and reduce the reduction amount significantly from that of the related art which does not involve the correction operation of the switching transistor 27.

Consequently, if it is assumed that the gate-source voltage Vgs of the driving transistor 22 is equal among all pixels, the light emission luminance of a pixel in which leak occurs with the switching transistor 24 becomes substantially equal to that of those pixels which do not suffer from leak, and the dispersion of the light emission luminance for each pixel arising from leak can be eliminated. Therefore, a display image of high picture quality can be obtained.

[Modifications]

In the embodiment described above, the present invention is applied to the organic EL display apparatus 10 which includes pixels 20 of a 6-Tr/1-C pixel configuration which includes, in addition to a switching transistor 27, a driving transistor 22, a writing (sampling) transistor 23, switching transistors 24 to 26 and a holding capacitor 28. However, the present invention is not limited to the application.

In particular, the switching transistors 24 and 25 are not essentially required components, but the present invention can be applied to any organic EL display apparatus which includes pixels of a configuration including at least the switching transistor 24 connected in series to the driving transistor 22 for controlling light emission operation of the organic EL device 21.

Further, while, in the embodiment described above, the present invention is applied to an organic EL display apparatus wherein an organic EL device is used as an electro-optical device of each pixel 20, the present invention is not limited to the particular application. In particular, the present invention can be applied to any display apparatus which includes an electro-optical device (light emitting device) of the current driven type whose light emission luminance varies in response the value of current flowing through the device.

[Applications]

The display apparatus of the present invention described above can be applied as various electronic apparatus shown as examples in FIGS. 8 to 12. In particular, the display apparatus can be applied as a display apparatus for electronic apparatus in all fields which display an image signal inputted to the electronic apparatus or an image signal produced in the electronic apparatus as an image such as portable terminal apparatus such as a digital camera, a laptop type personal computer and a portable telephone set and a video camera.

By using the display apparatus according to the embodiment of the present invention as a display apparatus of an electronic apparatus in various fields, the display apparatus according to the embodiment of the present invention can suppress drop of the light emission luminance arising from leak of a particular switching transistor and eliminate the dispersion of the light emission luminance among different pixels as apparent from the foregoing description of the embodiment of the present invention. Therefore, in various electronic apparatus, it is possible to achieve higher definition of the display apparatus and obtain a display image of high picture quality.

It is to be noted that the display apparatus according to the embodiment of the present invention includes a module type display apparatus of an enclosed configuration. This may be, for example, a display module wherein the display apparatus is adhered to a transparent opposing portion of glass or the like of the pixel array section 30. A color filter, a protective film and so forth as well as a light intercepting film described hereinabove may be provided on the transparent opposing section. It is to be noted that the display module may include a circuit section, an FPC (flexible printed circuit) or the like for inputting and outputting a signal and so forth from the outside to the pixel array section and vice versa.

In the following, particular examples of an electronic apparatus to which the present invention is applied are described.

Figure 8:
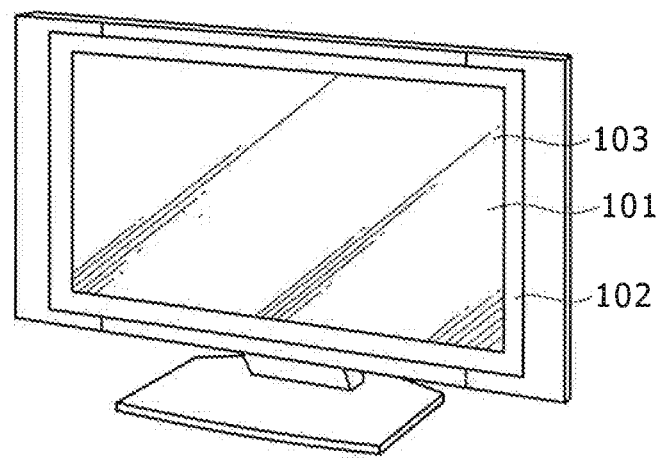
FIG. 8 is a perspective view showing an appearance of a television receiver to which the present invention is applied.

FIG. 8 shows an appearance of a television receiver to which the present invention is applied. Referring to FIG. 8, the television receiver shown includes an image display screen section 101 composed of a front panel 102, a glass filter 103 and so forth. The display apparatus according to the embodiment of the present invention can be used as the image display screen section 101.

Figure 9A:
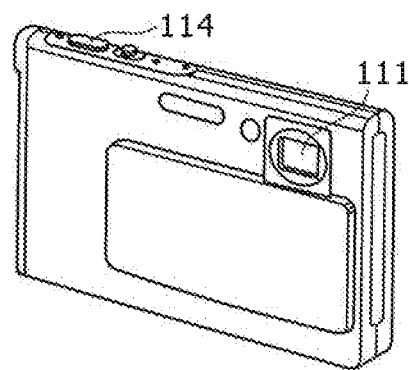
Figure 9B:
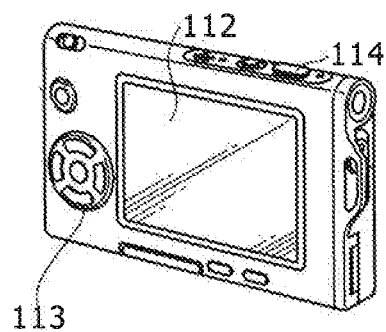

FIGS. 9A and 9B show an appearance of a digital camera to which the present invention is applied. Referring to FIGS. 9A and 9B, the digital camera shown includes a light emitting section 111 for emitting flashlight, a display section 112, a menu switch 113, a shutter button 114 and so forth. The display apparatus according to the embodiment of the present invention can be used as the display section 112.

Figure 10:
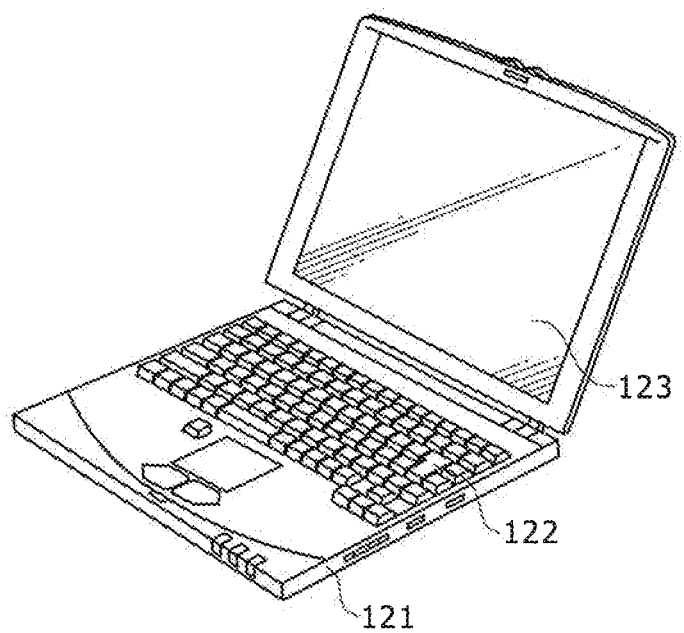
FIG. 10 is a perspective view showing an appearance of a laptop type personal computer to which the present invention is applied.

FIG. 10 shows an appearance of a laptop type personal computer to which the present invention is applied. Referring to FIG. 10, the laptop type personal computer shown includes a body 121, a keyboard 122 for being operated to input a character or the like, a display section 123 for displaying an image, and so forth. The display apparatus according to the embodiment of the present invention can be used as the display section 123.

Figure 11:
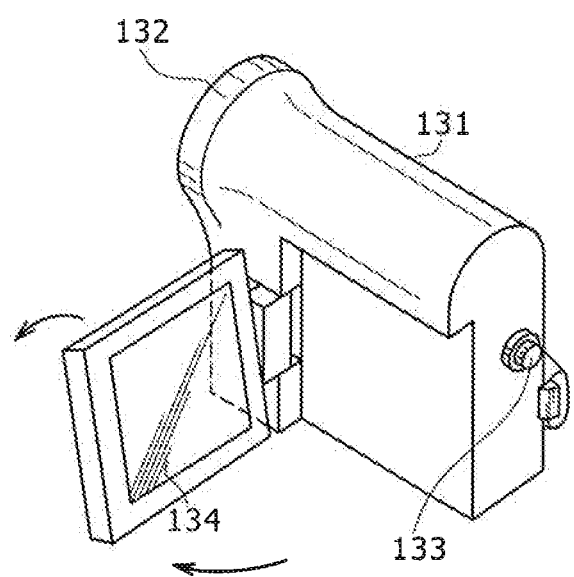
FIG. 11 is a perspective view showing an appearance of a video camera to which the present invention is applied.

FIG. 11 shows an appearance of a video camera to which the present invention is applied. Referring to FIG. 11, the video camera shown includes a body section 131, a lens 132 provided on a face of the body section 131 for picking up an image of an image pickup object, a start/stop switch 133 for being operated to start or stop image pickup and a display section 134. The display apparatus according to the embodiment of the present invention can be used as the display section 134.

FIGS. 12A to 12G show an appearance of a portable terminal apparatus such as a portable telephone set to which the present invention is applied. Referring to FIGS. 12A to 12G, the portable telephone set shown includes an upper side housing 141, a lower side housing 142, a connection section 143 in the form of a hinge, a display section 144, a sub display section 145, a picture light 146 and a camera 147. The display apparatus according to the embodiment of the present invention can be used as the display section 144 or the sub display section 145.

While a preferred embodiment of the present invention has been described using specific terms, such description is for illustrative purpose only, and it is to be understood that changes and variations may be made without departing from the spirit or scope of the following claims.

What is claimed is:

1. A display apparatus, comprising:
a plurality of pixels, at least one of the plurality of pixels including:
an electro-optical device,
a holding capacitor having a first terminal and a second terminal,
a writing transistor configured to supply an image signal to the first terminal of the holding capacitor,
a driving transistor connected between a first voltage line and the electro-optical device and configured to drive the electro-optical device based on the image signal,
a first switching transistor connected to a drain electrode of the driving transistor and configured to control the electro-optical device to emit light,
a second switching transistor connected between the second terminal of the holding capacitor and a source electrode of the driving transistor,
a third switching transistor connected between a gate electrode of the driving transistor and a second voltage line and configured to initialize the gate electrode of the driving transistor, and
a fourth switching transistor connected between a third voltage line and the electro-optical device and configured to initialize the electro-optical device; and
a scanner circuit including a first scanner, a second scanner, and a third scanner,
wherein
the electro-optical device includes an anode, a cathode, and a light emitting element disposed between the anode and the cathode,
the holding capacitor and the second switching transistor are serially connected between the gate electrode and the source electrode of the driving transistor,
the first scanner is configured to place the writing transistor into a conducting state during a signal writing period,
the second scanner is configured to place the first switching transistor into a conducting state during a light emission period,
the third scanner is configured to place the second switching transistor into a non-conducting state during the signal writing period, and into a conducting state during the light emission period,
the first voltage line supplies a fixed voltage to the first switching transistor, and the first switching transistor is configured to control the light emission period of the electro-optical device to carry out duty driving.

2. The display apparatus according to claim 1, wherein a capacitance value of the holding capacitor is higher than a capacitance value of the electro-optical device.

3. The display apparatus according to claim 1, wherein, before the signal writing period, a gate potential and a source potential of the driving transistor are set to individually predetermined potentials.

4. The display apparatus according to claim 1, wherein, during the signal writing period, the image signal is written successively into the plurality of pixels in a same row.

5. A display apparatus, comprising:
a plurality of pixels, at least one of the plurality of pixels including:
an electro-optical device,
a holding capacitor having a first terminal and a second terminal,
a writing transistor configured to supply an image signal to the first terminal of the holding capacitor,
a driving transistor connected between a first voltage line and the electro-optical device and configured to drive the electro-optical device based on the image signal,
a first switching transistor connected to a drain electrode of the driving transistor and configured to control the electro-optical device to emit light,
a second switching transistor connected between the second terminal of the holding capacitor and a source electrode of the driving transistor,
a third switching transistor connected between a gate electrode of the driving transistor and a second voltage line and configured to initialize the gate electrode of the driving transistor, and
a fourth switching transistor connected between a third voltage line and the electro-optical device and configured to initialize the electro-optical device; and
a scanner circuit,
wherein
the electro-optical device includes an anode, a cathode, and a light emitting element disposed between the anode and the cathode,
the holding capacitor and the second switching transistor are disposed between the gate electrode and the source electrode of the driving transistor,
the scanner circuit is configured to cause the writing transistor to be in a conductive state during a first period and configured to cause the second switching transistor to be in a non-conducting state during a second period,
the first period and the second period are configured to partially overlap,
the scanner circuit is configured to cause the second switching transistor to switch to a conducting state when the first switching transistor is turned on to the conducting state,
the first voltage line supplies a fixed voltage to the first switching transistor, and
the first switching transistor is configured to carry out duty driving.

6. The display apparatus according to claim 5, wherein a capacitance value of the holding capacitor is higher than a capacitance value of the electro-optical device.

7. The display apparatus according to claim 5, wherein, before the signal writing period, a gate potential and a source potential of the driving transistor are set to individually predetermined potentials.

8. The display apparatus according to claim 5, wherein, during the signal writing period, the image signal is written successively into the plurality of pixels in a same row.

9. A display apparatus, comprising:
a plurality of pixels, at least one of the plurality of pixels including:
an electro-optical device,
a holding capacitor having a first terminal and a second terminal,
a writing transistor configured to supply an image signal to the first terminal of the holding capacitor,
a driving transistor connected between a first voltage line and the electro-optical device and configured to drive the electro-optical device based on the image signal,
a first switching transistor connected to a drain electrode of the driving transistor and configured to control the electro-optical device to emit light,
a second switching transistor connected between the second terminal of the holding capacitor and a source electrode of the driving transistor,
a third switching transistor connected between a gate electrode of the driving transistor and a second voltage line and configured to initialize the gate electrode of the driving transistor, and
a fourth switching transistor connected between a third voltage line and the electro-optical device and configured to initialize the electro-optical device,
wherein
the electro-optical device includes an anode, a cathode, and a light emitting element disposed between the anode and the cathode,
the holding capacitor and the second switching transistor are serially connected between the gate electrode and the source electrode of the driving transistor,
the first voltage line supplies a fixed voltage to the first switching transistor, and
the first switching transistor is configured to control a light emission period of the electro-optical device to carry out duty driving.

10. The display apparatus according to claim 9, further comprising a scanner circuit including a first scanner, a second scanner, and a third scanner,
wherein
the first scanner is configured to place the writing transistor into a conducting state during a signal writing period,
the second scanner is configured to place the first switching transistor into a conducting state during the light emission period, and
the third scanner is configured to place the second switching transistor into a non-conducting state during the signal writing period, and into a conducting state during the light emission period.

11. The display apparatus according to claim 9, wherein a capacitance value of the holding capacitor is higher than a capacitance value of the electro-optical device.

12. The display apparatus according to claim 9, wherein a gate potential and a source potential of the driving transistor are configured to set to individually predetermined potentials.

13. The display apparatus according to claim 9, wherein the image signal is written successively into the plurality of pixels in a same row.

* * * * *